United States Patent [19]
Matsukawa et al.

[11] Patent Number: 5,559,736
[45] Date of Patent: Sep. 24, 1996

[54] NON-VOLATILE SEMICONDUCTOR MEMORY DEVICE CAPABLE OF PREVENTING EXCESSIVE-WRITING

[75] Inventors: Naohiro Matsukawa, Kamakura; Keniti Imamiya, Kawasaki; Toshiharu Watanabe; Michiharu Matsui, both of Yokohama, all of Japan

[73] Assignee: Kabushiki Kaisha Toshiba, Kawasaki, Japan

[21] Appl. No.: 424,646

[22] Filed: Apr. 19, 1995

[30] Foreign Application Priority Data

Apr. 20, 1994 [JP] Japan .................................. 6-081617

[51] Int. Cl.⁶ .................................. G11C 11/34
[52] U.S. Cl. .................. 365/185.24; 365/185.14; 365/185.29; 365/218
[58] Field of Search ................. 365/185.14, 185.24, 365/185.29, 185.3, 185.17, 218

[56] References Cited

PUBLICATIONS

Publication, "A Novel Erasing Technology for 3.3V Flash Memory with 64Mb Capacity and Beyond", by K. Oyama et al., pp. 24.5.1–24.5.4, Dec. 2, 1990.

*Primary Examiner*—David C. Nelms
*Assistant Examiner*—F. Niranjan
*Attorney, Agent, or Firm*—Banner & Allegretti, Ltd.

[57] ABSTRACT

After data is written into a desired memory cell of a memory cell array, a booster circuit verifies the threshold voltage of the memory cell in which data is written. An erase timing signal generation circuit connected to a control circuit generates a timing signal for a short period of time when a memory cell having a threshold voltage higher than the power supply voltage. An erasing voltage generation circuit applies a negative erasing voltage to the memory cell in which data is written for a short period of time according to the timing signal supplied from the erase timing signal generation circuit to slightly lower the threshold voltage of the memory cell so as to prevent the excessive writing.

33 Claims, 4 Drawing Sheets

NON-VOLATILE SEMICONDUCTOR MEMORY DEVICE CAPABLE OF PREVENTING EXCESSIVE-WRITING

BACKGROUND OF THE INVENTION

1. Field of the Invention

This invention relates to a non-volatile semiconductor memory device which can be applied to a flash memory, for example.

2. Description of the Related Art

Figure 10:
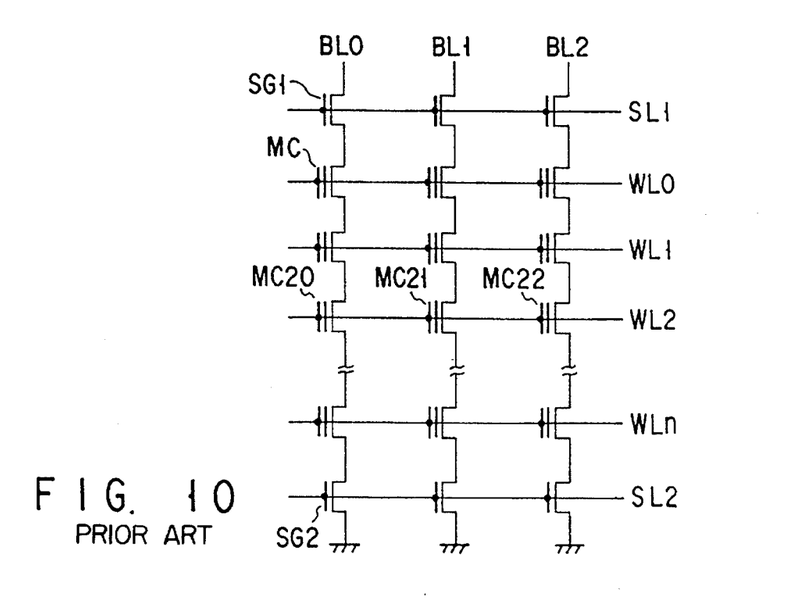
FIG. 10 is a circuit diagram for illustrating the conventional operation of a NAND-structured cell.

FIG. 10 shows a NAND-structured cell using an EEPROM. One NAND is constructed by serially connecting the current paths of a plurality of memory cells MC and connecting first and second selection gates SG1 and SG2 to both ends of the series circuit of memory cells MC. The first selection gates SG1 in the respective NANDs are connected to bit lines BL0, BL1, BL2, respectively, and the second selection gates SG2 are grounded. The control gates of the memory cells of each NAND are respectively connected to word lines WL0, WL1, WL2, —, WLn. The gates of the first selection gates SG1 are connected to a first selection line SL1 and the gates of the second selection gates SG2 are connected to a second selection line SL2.

With the above construction, the operation effected when data stored in the memory cell is read out is explained. First, in a case where data is read out from the memory cell connected to the word line WL2, 0 V is applied to the word line WL2 and a power supply voltage Vcc, for example, 5 V is applied to all of the other word lines, all of the bit lines, and all of the first and second selection lines. The memory cells connected to the non-selected word lines act as transfer gates and data is read out from the cell transistor connected to the selected word line WL2 via the transfer gates. That is, data of "1" or "0" is determined according to whether the cell transistor is set in the ON or OFF state. Therefore, the threshold voltage of the memory cell storing data "1" must be negative and the threshold voltage of the memory cell storing data "0" must be positive. Further, the threshold voltage of the memory cell acting as the transfer gate must be lower than potential Vcc.

On the other hand, when data is written into the memory cell, the data writing operation is effected for each word line. For example, in a case where data is written into the memory cell connected to the word line WL2, 20 V is applied to the word line WL, 10 V is applied to all of the other word lines, 12 V is applied to the first selection line SL1, and 0 V is applied to the second selection line SL2. If the potentials of the bit lines BL0, BL1 and BL2 are respectively set at 0 V, 10 V and 0 V, the potential difference between the channel and the control gate of each of the memory cells MC20 and MC22 is set to 20 V and electrons are injected into the floating gates of the memory cells MC20 and MC22 by F-N (Fowler-Nordheim) tunneling. No tunneling phenomenon occurs in the memory cell MC21 since the potential difference between the channel and the control gate thereof is small and no electrons are injected into the floating gate thereof.

Even when the same voltage is applied to the memory cells, the injection amount of electrons is different in the memory cells and the threshold voltage cannot be set to a constant value. As the cause for a variation in the threshold voltage, it is considered that the ratio of a capacitance between the control gate and the floating gate to a capacitance between the substrate and the floating gate is not constant. Therefore, it is considered that the potential of the floating gate becomes different for each memory cell and the injection amount of electrons becomes different when a high potential is applied to the word line.

In order to cope with the above case, data is read out from the memory cell and verified to check whether the condition of the threshold voltage is satisfied or not when the writing operation is completed. If it is detected that data is not correctly written as the result of verification, the writing operation is repeatedly effected until the lower limit of the threshold voltage of the memory cell into which data "0" is written becomes higher than 0.5 V, for example.

However, in a case where data is written in the above-described manner and if a variation in the threshold voltage of the memory cells is large, the upper limit of the threshold voltage of the memory cell into which data "0" is written sometimes exceeds Vcc when the lower limit of the threshold voltage of the memory cell into which data "0" is written has exceeded 0.5 V. Since the memory cell which is thus excessively written cannot act as the transfer gate at the data readout time, it becomes impossible to read out data of one NAND containing the above memory cell.

SUMMARY OF THE INVENTION

An object of this invention is to provide a non-volatile semiconductor memory device capable of narrowing the range of the distribution of the threshold voltages after the writing operation to prevent excessive-writing.

The above object can be attained by a non-volatile semiconductor memory device comprising a memory cell array having a plurality of memory cells each having a control gate and a floating gate and arranged in a matrix form, the memory cell array having a plurality of word lines to which the control gates of the plurality of memory cells are connected; data writing means connected to the memory cell array, for writing data into the floating gates of a plurality of memory cells which are contained in the plurality of memory cells and are simultaneously selected by one of the plurality of word lines; and data erasing means connected to the memory cell array, for supplying an erasing voltage to each of the memory cells into which data is written for a short period of time to slightly lower the threshold voltage of each of the memory cells.

That is, this invention utilizes a phenomenon that data will be erased quickly larger degree in a memory cell having a higher threshold voltage when data is erased. Namely, the threshold voltage of the memory cells having the higher threshold voltage is lowered and the excessive writing is prevented by applying an erasing voltage to the memory cells into which data has been written for a short period of time.

The erasing means can lower the threshold voltages of the memory cells by applying a high negative voltage to the control gates of the memory cells in the unit of a plurality of memory cells connected to one word line or in the unit of a plurality of memory cells connected to a plurality of word lines.

Further, the verifying operation is effected after the data writing, and if a memory cell whose threshold voltage is higher than a preset voltage level is detected by the verifying operation, the erasing operation may be effected by applying an erasing voltage from the erasing means to the memory cells for a short period of time. In this case, the excessive writing can be prevented with high reliability.

The erasing operation by the erasing means after the writing operation is effected only for time required for lowering the threshold voltage of the memory cell having the lowest threshold voltage by 0.1 V to 0.2 V. Therefore, the range of the distribution of the threshold voltages of the memory cells can be narrowed in a short period of time.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

There will now be described an embodiment of this invention with reference to the accompanying drawings.

Figure 1:
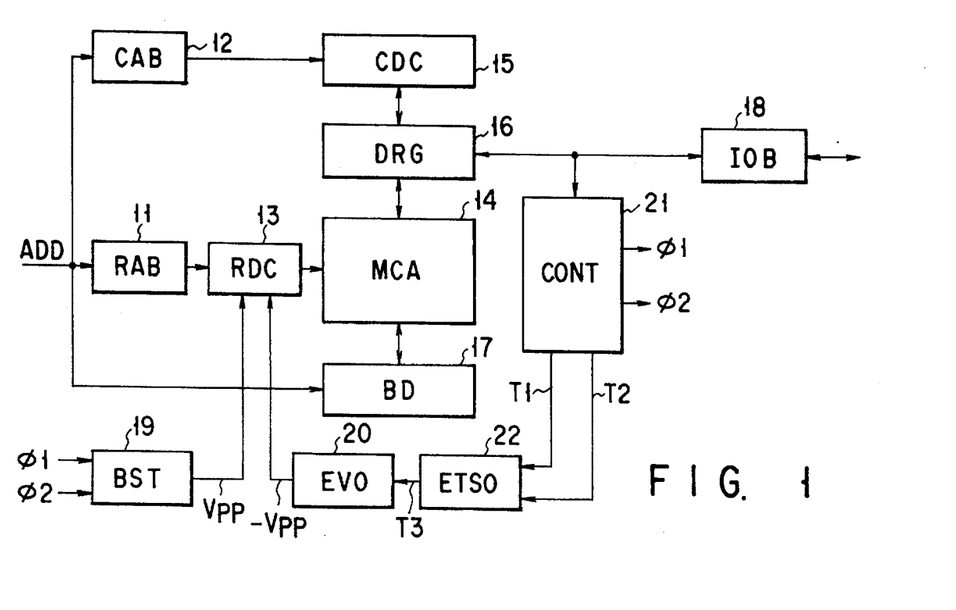
FIG. 1 is a circuit construction diagram schematically showing one embodiment of this invention.

FIG. 1 shows a non-volatile semiconductor memory device according to one embodiment of this invention. An address signal ADD is supplied to a row address buffer (RAB) 11 and column address buffer (CAB) 12. A row decoder (RDC) 13 decodes an address signal output from the row address buffer 11 to select the word line of a memory cell array (MCA) 14. A column decoder (CDC) 15 decodes an address signal output from the column address buffer 12 to select the bit line of the memory cell array 14 via a data register (DRG) 16 containing a sense amplifier (not shown). Further, the address signal ADD is supplied to a block decoder (BD) 17. The block decoder 17 selects a plurality of word lines between a pair of select gates. Data read out from a selected memory cell is latched in the data register 16 and data latched in the data register 16 is output via an input/output buffer (IOB) 18. At the data writing time, data supplied to the input/output buffer 18 is transferred to the data register 16 and supplied from the data register 16 to the selected bit line.

A control circuit 21 is connected to the data register 16. The control circuit 21 controls the operation of writing data into the memory cell, the operation of verifying written data, the operation of slightly lowering the threshold voltage according to the excessive writing which will be described later, the operation of reading out data stored in the memory cell, and the operation of simultaneously erasing data stored in the memory cells. The control circuit 21 is connected to a booster circuit (BST) 19 and to an erasing voltage generation circuit (EVO) 20 via an erasing timing generation circuit (ETSO) 22. The erasing voltage generation circuit 20 and booster circuit 19 are connected to the row decoder 13.

The booster circuit 19 creates a writing voltage Vpp (20 V) according to clock signals $\phi 1$, $\phi 2$ output from the control circuit 21 at the data writing time. The erasing voltage generation circuit 20 creates an erasing voltage $-$Vpp ($-$20 V) used for the erasing operation according to the control of the control circuit 21. The erasing timing generation circuit 22 controls the erasing voltage generation circuit 20 for a short period of time according to a signal T3 created based on signals T1, T2 output from the control circuit 21 and supplies the erasing voltage $-$Vpp to the memory cell into which data "0" is written to slightly lower the threshold voltage of the memory cell.

Figure 2:
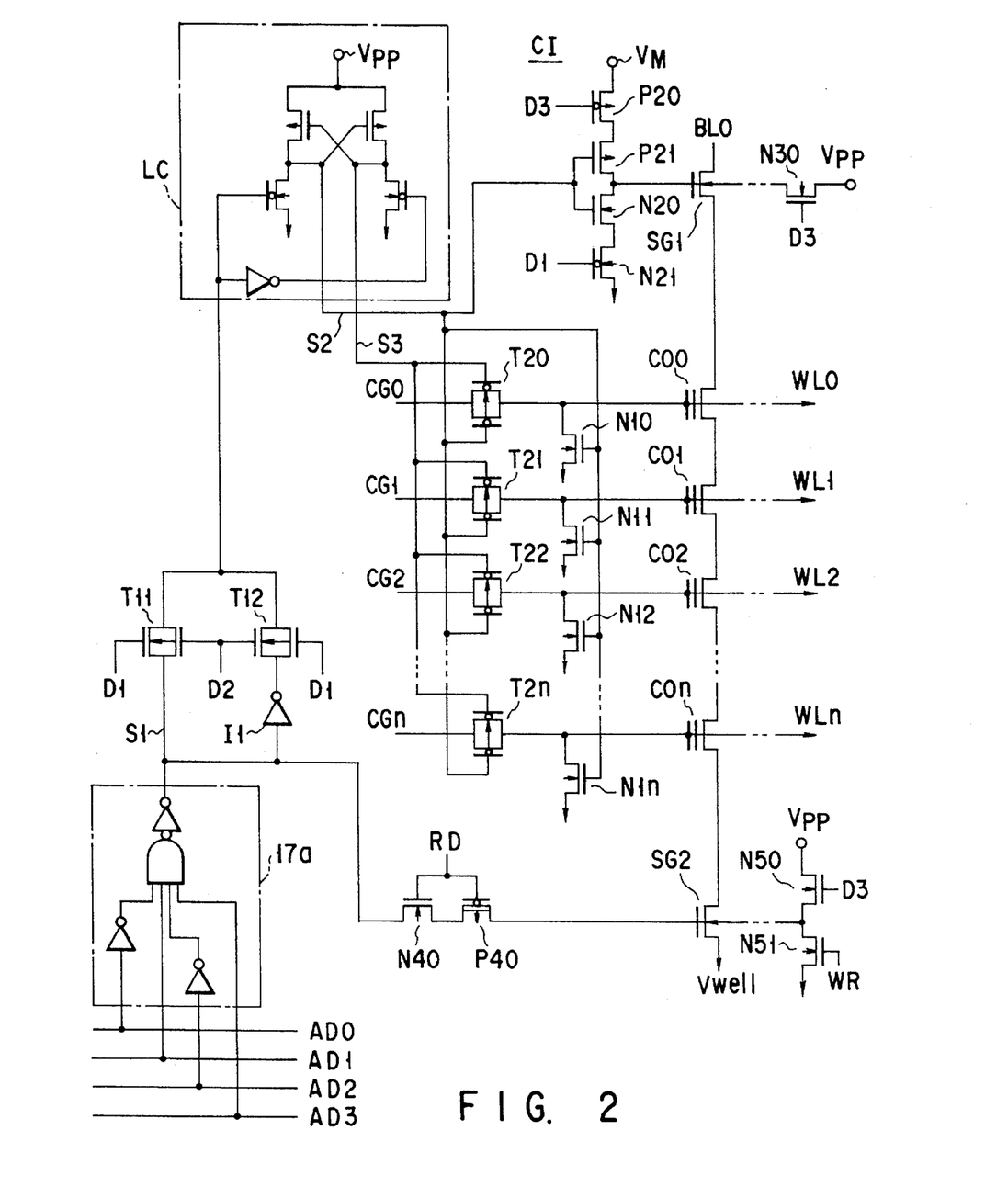
FIG. 2 is a circuit diagram showing the main portion of the circuit shown in FIG. 1.

FIG. 2 concretely shows the memory cell array 14, block decoder 17 and the like. In FIG. 2, a block decoder 17a selects one of the blocks in the memory cell array. The block decoder 17a is connected to address buses AD0 to AD3. An output signal S1 of the block decoder 17a is supplied to the input terminal of a transfer gate T11 and to the input terminal of transfer gate T12 via an inverter circuit I1. A signal D1 is supplied to the gate of an N-channel transistor constructing the transfer gate T11 and the gate of a P-channel transistor constructing the transfer gate T12, and a signal D2 is supplied to the gate of a P-channel transistor constructing the transfer gate T11 and the gate of an N-channel transistor constructing the transfer gate T12. The output terminals of the transfer gates T11, T12 are connected to the input terminal of a level conversion circuit LC.

The level conversion circuit LC converts a signal of Vcc level to a signal of Vpp level and complementary output signals S2 and S3 of Vpp level are output from the level conversion circuit LC. The output signal S2 of the level conversion circuit LC is supplied to the gates of P-channel transistors constructing transfer gates T20, T21 to T2n, and the output signal S3 of the level conversion circuit LC is supplied to the gates of N-channel transistors constructing the transfer gates T20, T21 to T2n. The input terminals of the transfer gates T20, T21 to T2n are supplied with output signals CG0, CG1 to CGn of the row decoder 13 shown in FIG. 1 and the output terminals thereof are respectively connected to word lines WL0, WL1 to WLn. The word lines WL0, WL1 to WLn are respectively connected to the drains of N-channel transistors N10, N11 to N1n. The sources of the N-channel transistors N10, N11 to N1n are grounded and the gates thereof are supplied with the output signal S2 of the level conversion circuit LC.

The control gates of memory cells C00, C001 to C0n each constructed by an EEPROM are connected to the word lines WL0, WL1 to WLn and the current paths of the memory cells C00, C01 to C0n are serially connected. The drain of the memory cell C00 is connected to the source of the first selection gate SG1 and the source of the memory cell C0n is connected to the drain of the second selection gate SG2. The drain of the first gate SG1 is connected to a bit line BL0 and the gate thereof is connected to the output terminal of a clocked inverter circuit CI. The clocked inverter circuit CI is constructed by P-channel transistors P20, P21 and N-channel transistors N20, N21 whose current paths are serially connected between the input terminal of potential $V_M$ and the ground terminal. The gate of the P-channel transistor P20 is supplied with a signal D3 and the gate of the N-channel transistor N21 is supplied with the signal D1. The gates of the P-channel transistor P21 and N-channel transistor N20 are supplied with the output signal S2 of the level conversion circuit LC and the drains thereof are connected to the gate of the first selection gate SG1. Further, the gate of the first selection gate SG1 is connected to the source of an N-channel transistor N30. The gate of the N-channel transistor N30 is supplied with the signal D3 and the drain thereof is applied with the potential Vpp.

The source of the second selection gate SG2 is coupled to a well potential Vwell. The current paths of a depletion type P-channel transistor P40 and an N-channel transistor N40 are serially connected between the gate of the second selection gate SG2 and the output terminal of the block decoder 17a. The gates of a P-channel transistor P40 and an N-channel transistor N40 are supplied with a readout control signal RD. Further, the gate of the second selection gate SG2 is connected to the source of an N-channel transistor N50 and the drain of an N-channel transistor N51. The gate of the N-channel transistor N50 is supplied with the signal D3 and the drain thereof is applied with the potential Vpp. The gate of the N-channel transistor N51 is supplied with a write control signal WR and the source thereof is grounded.

FIG. 2 shows only one NAND, but a plurality of NANDS are connected to the word lines WL0, WL1 to WLn. In FIG. 2, transistors having a circular mark attached between the gate and channel are transistors whose threshold voltages are set to "0".

Figure 3:
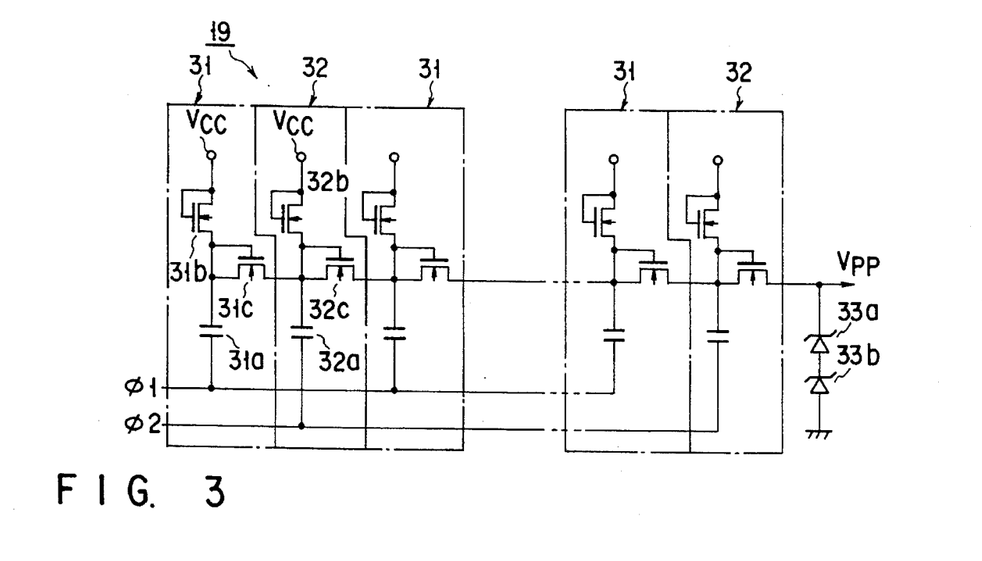
FIG. 3 is a circuit diagram showing the main portion of the circuit shown in FIG. 1.

FIG. 3 shows an example of the booster circuit 19. The booster circuit 19 has first and second charge pump circuits 31 and 32 which are alternately arranged and are cascade-connected. The first charge pump circuit 31 is constructed by a capacitor 31a and N-channel transistors 31b, 31c, and the second charge pump circuit 32 is constructed by a capacitor 32a and N-channel transistors 32b, 32c. In the first charge pump circuit 31, a pulse signal φ1 output from the control circuit 21 is supplied to one end of the capacitor 31a. The source of the N-channel transistor 31b is connected to the other end of the capacitor 31a and the gate and drain thereof are connected to the power supply Vcc. The gate and source of the N-channel transistor 31c are connected to the other end of the capacitor 31a and the drain thereof is connected to the second charge pump circuit 32 of the next stage. In the second charge pump circuit 32, a pulse signal φ2 output from the control circuit 21 is supplied to one end of the capacitor 32a. The source of the N-channel transistor 32b is connected to the other end of the capacitor 32a and the gate and drain thereof are connected to the power supply Vcc. The gate and source of the N-channel transistor 32c are connected to the other end of the capacitor 32a and the drain thereof is connected to the first charge pump circuit 31 of the next stage. Zener diodes 33a, 33b are serially connected between the output terminal of the second charge pump circuit 32 of final stage and the ground and the zener diodes 33a, 33b limit the raised voltage to a preset potential.

Figure 4:
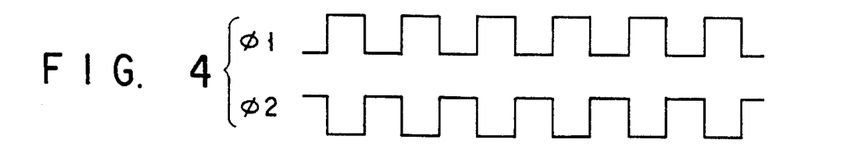
FIG. 4 is a timing chart for illustrating the operation of the circuit shown in FIG. 3.

In the booster circuit 19 with the above construction, the first and second charge pump circuits 31, 32 are sequentially operated according to the pulse signals φ1, φ2 output from the control circuit 21 as shown in FIG. 4 and a high voltage Vpp for writing is derived between two ends of a series circuit of Zener diodes 33a, 33b.

various types of circuit constructions of the erasing voltage generation circuit 20 for generating a high negative voltage are known, but it may be formed with substantially the same construction as that of the booster circuit shown in FIG. 3, for example, and the N-channel transistors in the booster circuit 19 are replaced by P-channel transistors to reverse the current flow. The erasing voltage generation circuit 20 generates a voltage of −Vpp according to the control of the control circuit 21.

Figure 5:
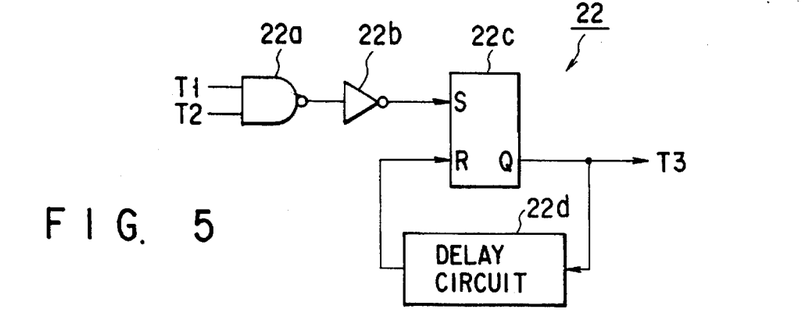
FIG. 5 is a circuit diagram showing the main portion of the circuit shown in FIG. 1.

FIG. 5 shows the erase timing generation circuit 22. The set signal input terminals of a NAND circuit 22a are supplied with signals T1 and T2 output from the control circuit 21. An output signal of the NAND circuit 22a is supplied to the set terminal S of a flip-flop circuit 22c via an inverter circuit 22b. An erase command signal T3 output from the output terminal Q of the flip-flop circuit 22c is supplied to the erasing voltage generation circuit 20 and to the reset signal input terminal R of the flip-flop circuit 22c via an erase delay circuit 22d.

The operation of the circuit with the above construction shown in FIGS. 1, 2 and 5 is explained. In the circuit of FIG. 2, when data "0101" is supplied to the address buses AD0 to AD3, for example, the block decoder 17a is selected and an output signal S1 of the block decoder 17a is set to the high level (Vcc level).

At the data writing time, the signals D1 and D2 are set to the high level (Vcc level) and low level (0 level), respectively. As a result, the output signal S1 of the block decoder 17a is supplied to the level conversion circuit LC via the transfer gate T11. The output signals S2 and S3 of the level conversion circuit LC are respectively set to 0 V and Vpp (20 V) according to the output signal S1. Therefore, the transfer gates T20, T21 to T2n supplied with the output signals S2 and S3 are all set into the ON state and the output signals CG0, CG1 to CGn of the row decoder 13 are supplied to the word lines WL0, WL1 to WLn via the transfer gates T20, T21 to T2n, respectively. The potentials of those of the output signals CG0, CG1 to CGn of the row decoder 13 which are supplied to the selected word lines are set to Vpp and the potentials of those of the output signals CG0, CG1 to CGn which are supplied to the non-selected word lines are set to the intermediate potential $V_M$ (10 V).

Since the signal D3 is set at 0 V, the P-channel transistor P20 of the clocked inverter CI is set in the conductive state and an output from the output terminal of the clocked inverter CI is set to the high level ($V_M$) according to the output signal S2 of the level conversion circuit LC. As a result, the first selection gate SG1 is set into the conductive state and a voltage applied to the bit line BL0 is applied to the memory cells C00, C01 to C0n. At this time, the potential of the selected bit line is set at 0 V and the potential of the non-selected bit line is set at $V_M$. Therefore, the potential difference between the control gate and the channel region (well) becomes 20 V and electrons are injected into the floating gate from the channel region by F-N tunneling only in the memory cell which lies at the intersection between the selected word line and bit line. At this time, since the readout control signal RD and write control signal WR are respectively set at 0 V and $V_{cc}$, the P-channel transistor P40 and N-channel transistor N51 are set in the ON state. Therefore, the gate of the second selection gate SG2 is set to the ground potential and the second selection gate SG2 is set in the OFF state.

At the data erasing time, the signals D1 and D2 are set to 0 V and Vcc level, respectively, and the transfer gate T11 is set into the OFF state and the transfer gate T12 is set into the ON state. Therefore, an inverted signal of the output signal S1 of the block decoder 17a is supplied to the level conversion circuit LC as a low level signal. As a result, the output signals S2 and S3 of the level conversion circuit LC are respectively set to Vpp and 0 V and the transfer gates T20, T21 to T2n are all set into the OFF state. Therefore, the potentials of the word lines WL0, WL1 to WLn are set to the low level. At this time, electrons are extracted from the floating gates of all of the memory cells into the channel regions by setting the potential of the well (not shown) in which the memory cells are formed to Vpp, thus simultaneously erasing data.

At this time, the signal D3 is set to the voltage of Vpp and the readout control signal RD and write control signal WR are set to 0 V. Therefore, the voltage Vpp is applied to the gates of the first and second selection gates SG1 and SG2 so as to prevent the voltage Vpp from being applied to the gate oxide films of the first and second selection gates SG1, SG2.

Further, at the data readout time, the potentials of those of the output signals CG0, CG1 to CGn of the row decoder 13 which correspond to the selected word lines are set to 0 V and the potentials of those of the output signals CG0, CG1 to CGn which correspond to the non-selected word lines are set to Vcc, the signal D3 is set at 0 V, and the readout control signal RD and write control signal WR are respectively set to Vcc and 0 V. As a result, the first and second selection gates SG1 and SG2 are set into the ON state. Therefore, data stored in the memory cell is read out depending on whether a cell current flows in the bit line or not.

After the write operation is completed, the threshold voltage of the memory cell in which data "0" is stored is verified. As a result, if the threshold voltage of the memory cell does not exceed 0.5 V, for example, the write operation which is the same as the write operation described above is effected for a preset period of time. The sequence is repeatedly effected until the threshold voltage of the memory cell into which data "0" is written exceeds 0.5 V.

If the data writing characteristic of each memory cell is significantly different, there occurs a possibility that the threshold voltage of some of the memory cells into which data "0" is written is set to 0.7 V and the threshold voltage of the other memory cells is set to a voltage of, for example, 5.2 V which is higher than the power supply voltage Vcc. The memory cell into which data is excessively written cannot be operated as a transfer gate at the data readout time and data cannot be read out from a NAND containing the above memory cell.

When the verify operation is started, the control circuit 21 supplies the signal T1 to the erase timing signal generation circuit 22 shown in FIG. 5. If the control circuit 21 detects a memory cell whose threshold voltage exceeds the power supply voltage Vcc as the verify operation proceeds, it outputs the signal T2 to the erase timing signal generation circuit 22. The flip-flop circuit 22c of the erase timing signal generation circuit 22 is set when the signals T1, T2 are set at the high level and outputs the signal T3 as an erase command signal from the output terminal thereof for a short period of time set by the delay circuit 22d. The signal T3 is supplied to the erasing voltage generation circuit 20 which in turn supplies an erasing voltage −Vpp to the row decoder 13 shown in FIG. 1 according to the signal T3. The row decoder 13 supplies the erasing voltage −Vpp to the selected word line. In the memory cell to which the erasing voltage is supplied, electrons are emitted from the floating gate to slightly lower the threshold voltage.

In a case where the difference between the threshold voltages of the memory cells is caused by the capacitance ratio as described before, the potential of the floating gate of a memory cell which is one of the memory cells connected to the same word line and which has a large capacitance ratio becomes high at the data writing time, and the rate of injection of electrons is higher and the injection amount of electrons is larger in the above memory cell than in the memory cell having a small capacitance ratio. Therefore, the threshold voltage after the writing operation becomes higher in the memory cell having a larger capacitance ratio than in the memory cell having a smaller capacitance ratio. Further, when a high negative voltage is applied to the control gate at the data erasing time, the potential of the floating gate becomes higher in the memory cell having a larger capacitance ratio than in the memory cell having a smaller capacitance ratio. Therefore, the data erasing speed is higher and the erasing amount is larger in the memory cell having a larger capacitance ratio than in the memory cell having a smaller capacitance ratio.

Figure 6:
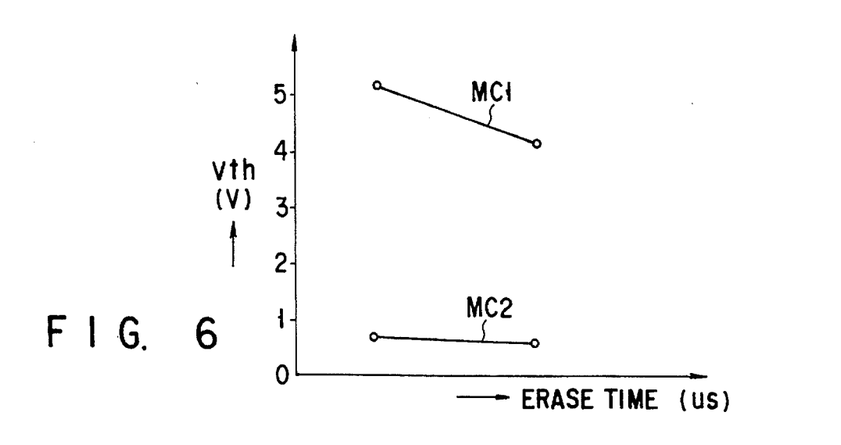
FIG. 6 is a diagram for illustrating the erasing operation effected after the writing operation.

FIG. 6 shows variations in the threshold voltages caused when an erasing voltage −Vpp is applied to the control gates of memory cells having different threshold voltages. As shown in FIG. 6, for example, when the erasing voltage −Vpp (−20 V) is applied to the control gates of a memory cell MC1 having a threshold voltage of 5.2 V after data writing and a memory cell MC2 having a threshold voltage of 0.7 V for a period of 10 μs, the threshold voltage of the memory cell MC1 is set to 4.2 V and the excessive writing state can be cancelled, and the threshold voltage of the memory cell MC2 is set to 0.6 V and the data "0" writing state can be maintained.

Figure 7:
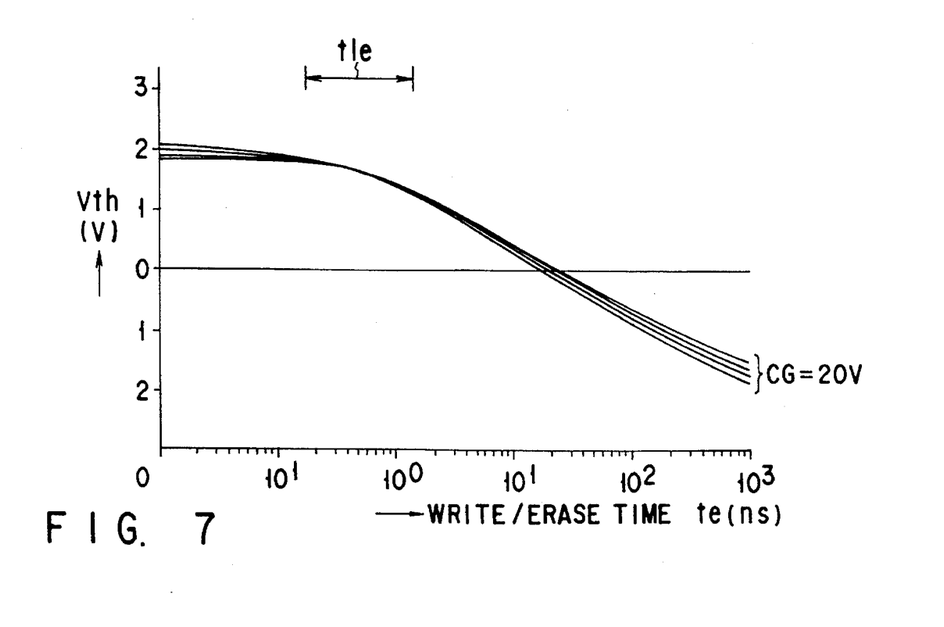
FIG. 7 is a diagram for illustrating the erasing operation effected after the writing operation.

Particularly, the inventor of this invention confirmed that the threshold voltages of a plurality of memory cells whose threshold voltages were not so different from one another coincided with one another in the range of time tle when a negative erasing voltage was simultaneously applied to the memory cells as shown in FIG. 7. Therefore, it becomes possible to make the threshold voltages of the memory cells equal to one another by adequately setting the erasing time.

Time for erasing by use of a negative erasing voltage may be set to time required for lowering the threshold voltage of the memory cell having the lowest threshold voltage by 0.1 to 0.2 V although it depends on the capacitance ratio of the memory cell and the erasing voltage −Vpp. However, it is of course necessary to set the threshold voltage of the memory cell after the erasing to 0.5 V or more.

According to the above embodiment, the threshold voltage of the memory cell into which data is written is lowered by applying an erasing voltage for a short period of time after data is written into the memory cell. Therefore, the excessive writing to the memory cell can be prevented and the range of distribution of the threshold voltages can be narrowed.

In the above embodiment, a negative erasing voltage is applied to the control gate for a short period of time if it is detected that the excessive writing occurs by verifying the threshold voltages after data is written into the memory cells, but this invention is not limited to this embodiment, but it is possible to apply an erasing voltage for a short period of time each time data is written into the memory cell. In this case, even when no excessive writing occurs, the range of distribution of the threshold voltages can be narrowed.

Figure 8:
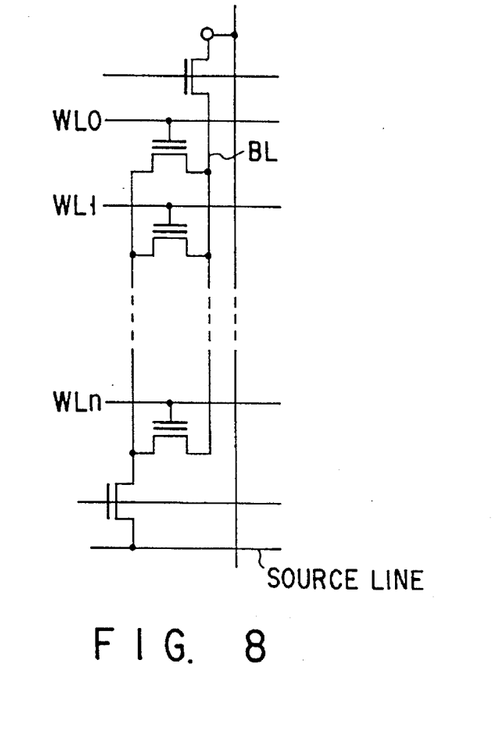
FIG. 8 is a circuit diagram showing an AND-structured cell.
Figure 9:
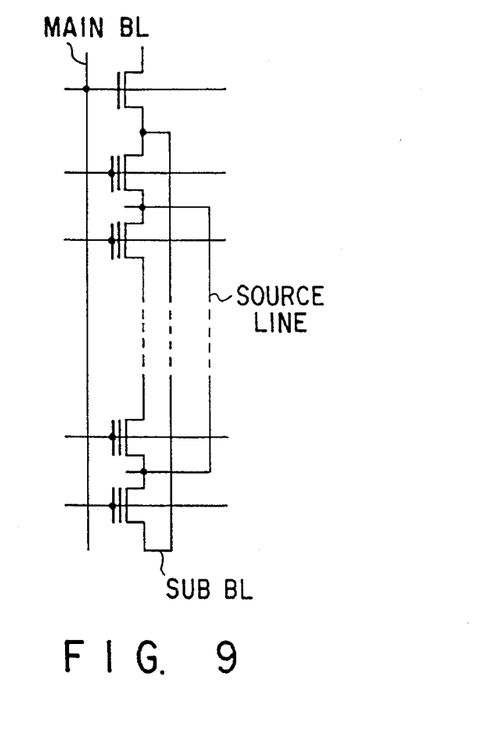
FIG. 9 is a circuit diagram showing a divided NOR-structured cell.

Further, in the above embodiment, a case wherein this invention is applied to the NAND-structured EEPROM is explained, but this invention is not limited to the above embodiment. For example, this invention can be applied to an AND-structured cell (shown in FIG. 8) in which data is written by use of F-N tunneling and data is read out by use of F-N tunneling or a DINOR-structured (Divided NOR-structured) cell (shown in FIG. 9).

The erasing operation after the writing is effected by simultaneously applying a high negative voltage to a plurality of memory cells connected to the same word line, but it is not limitative, and it is possible to simultaneously apply a high negative voltage to a plurality of memory cells connected to a plurality of word lines.

In the above embodiment, data is erased by applying a high negative voltage to the control gate, but it is not limitative, and it is possible to set the control gate to 0 V and set the substrate to a positive high voltage.

What is claimed is:

1. A non-volatile semiconductor memory device comprising:
    a memory cell array having a plurality of memory cells each having a control gate and a floating gate and arranged in a matrix form, said memory cell array having a plurality of word lines to which the control gates of said plurality of memory cells are connected;
    data writing means connected to said memory cell array, for writing data into the floating gates of a plurality of memory cells which are contained in said plurality of memory cells and are simultaneously selected by one of said plurality of word lines; and
    data erasing means connected to said memory cell array, for supplying an erasing voltage to each of said memory cells into which data is written for a short period of time to slightly lower the threshold voltage of each of said memory cells.

2. A device according to claim 1, wherein said data writing means includes positive potential generation means for applying a high potential to the control gate of a selected memory cell and said data erasing means includes negative potential generation means for applying a high negative potential to the control gate of a selected memory cell.

3. A device according to claim 1, wherein said erasing means simultaneously applies a high negative voltage to a plurality of memory cells connected to one word line.

4. A device according to claim 1, wherein said erasing means simultaneously applies a high negative voltage to a plurality of memory cells connected to a plurality of word lines.

5. A device according to claim 1, wherein said writing means includes detecting means for detecting the threshold voltage of the memory cell after data writing, and said erasing means applies a high negative voltage to the control gate of a selected memory cell when said detecting means detects a memory cell which has a threshold voltage higher than a preset voltage.

6. A device according to claim 1, wherein time for said erasing means to apply the erasing voltage to the memory cell is set to time required for lowering the threshold voltage of a memory cell having the lowest threshold voltage by 0.1 V to 0.2 V.

7. A device according to claim 1, wherein said erasing means erases data by applying 0 V to the control gate of a memory cell from which data is to be erased and applying a positive high voltage to the substrate and a memory cell in which data should be retained.

8. A device according to claim 1, wherein said memory cell is constructed by a NAND-structured cell using an EEPROM.

9. A device according to claim 1, wherein said memory cell is constructed by an AND-structured cell using an EEPROM.

10. A device according to claim 1, wherein said memory cell is constructed by a divided NOR-structured cell using an EEPROM.

11. A non-volatile semiconductor memory device comprising:
    a memory cell array having a plurality of memory cells each having a control gate and a floating gate and arranged in a matrix form, said memory cell array having a plurality of word lines to which the control gates of said plurality of memory cells are connected;
    a data selection circuit for selecting one of said word lines according to an address signal;
    a first voltage generation circuit connected to said selection circuit, for generating a high voltage to write data and applying the high voltage to one of said word lines selected by said selection circuit at the data writing time;
    a control circuit connected to said first voltage generation circuit, for driving said first voltage generation circuit at the data writing time and detecting the threshold voltage of a memory cell after the data writing;
    a timing signal generation circuit connected to said control circuit, for generating a timing signal for erasing data for a short period of time when threshold voltage of the memory cell detected by said control circuit is higher than a preset voltage; and
    a second voltage generation circuit connected to said selection circuit, for generating an erasing voltage for erasing data according to the timing signal supplied from said timing signal generation circuit and applying the erasing voltage to one of said word lines selected by said selection circuit to slightly lower the threshold voltages of said memory cells.

12. A device according to claim 11, wherein said first voltage generation circuit has a generation circuit for generating a positive high voltage.

13. A device according to claim 11, wherein said second voltage generation circuit has a generation circuit for generating a high negative voltage.

14. A device according to claim 11, wherein said second voltage generation circuit simultaneously applies a high negative voltage to a plurality of memory cells connected to a plurality of word lines.

15. A device according to claim 11, wherein said timing signal generation circuit includes a flip-flop circuit set when a memory cell having a threshold voltage higher than the preset voltage is detected by said control circuit; and a delay circuit connected between an output terminal of said flip-flop circuit and a reset signal input terminal thereof.

16. A device according to claim 15, wherein the timing signal generated from said timing signal generation circuit is determined according to time required for lowering the threshold voltage of a memory cell having the lowest threshold voltage by 0.1 V to 0.2 V.

17. A device according to claim 11, wherein said memory cell is constructed by a NAND-structured cell using an EEPROM.

18. A device according to claim 11, wherein said memory cell is constructed by an AND-structured cell using an EEPROM.

19. A device according to claim 11, wherein said memory cell is constructed by a divided NOR-structured cell using an EEPROM.

20. A non-volatile semiconductor memory device comprising:
    a memory cell array having a plurality of memory cells each having a control gate and a floating gate and arranged in a matrix form, said memory cell array having a plurality of word lines to which the control gates of said plurality of memory cells are connected;
    a data selection circuit for selecting one of said word lines according to an address signal;

a first voltage generation circuit connected to said selection circuit, for generating a high voltage to write data and applying the high voltage to one of said word lines selected by said selection circuit at the data writing time;

a control circuit connected to said first voltage generation circuit, for driving said first voltage generation circuit at the data writing time;

a timing signal generation circuit connected to said control circuit, for generating a timing signal for erasing data for a short period of time after the data writing is completed; and a second voltage generation circuit connected to said selection circuit, for generating an erasing voltage for erasing data according to the timing signal supplied from said timing signal generation circuit and applying the erasing voltage to one of said word lines selected by said selection circuit to slightly lower the threshold voltages of said memory cells.

21. A device according to claim 20, wherein said first voltage generation circuit has a generation circuit for generating a positive high voltage.

22. A device according to claim 20, wherein said second voltage generation circuit has a generation circuit for generating a high negative voltage.

23. A device according to claim 20, wherein said second voltage generation circuit simultaneously applies a high negative voltage to a plurality of memory cells connected to a plurality of word lines.

24. A device according to claim 20, wherein the timing signal generated from said timing signal generation circuit is determined according to time required for lowering the threshold voltage of a memory cell having the lowest threshold voltage by 0.1 V to 0.2 V.

25. A device according to claim 20, wherein said memory cell is constructed by a NAND-structured cell using an EEPROM.

26. A device according to claim 20, wherein said memory cell is constructed by an AND-structured cell using an EEPROM.

27. A device according to claim 20, wherein said memory cell is constructed by a divided NOR-structured cell using an EEPROM.

28. A method for writing data to a plurality of nonvolatile semiconductor memory cells, comprising the steps of:

applying a first voltage to selected ones of the cells, to raise a threshold voltage of the selected cells, and writing data into said selected cells; and applying a second voltage to said selected cells for a short period of time to slightly lower the threshold voltage of said selected cells, thereby to reduce a range of distribution of the threshold voltage of said selected cells.

29. A method according to claim 28, further including a step of verifying the threshold voltage of each of said selected cells.

30. A method according to claim 29, wherein said second voltage is applied to said selected cells when at least one of said selected cells is found to have a threshold voltage higher than a preset voltage level in said step of verifying.

31. A method according to claim 28, wherein said first voltage is a high positive potential.

32. A method according to claim 28, wherein said second voltage is a high negative potential.

33. A method for writing data to a plurality of nonvolatile semiconductor memory cells, comprising the steps of:

applying a high positive potential to control gates of selected ones of said cells to raise a threshold voltage of the selected cells, and writing data into said selected cells;

verifying the threshold voltage of each of said selected cells; and applying a high negative potential to said selected cells for a short period of time to slightly lower the threshold voltage of said selected cells when at least one of said selected cells is found to have a threshold voltage higher than a preset voltage level in said step of verifying, and to reduce the range of distribution of the threshold voltage of said selected cells.

\* \* \* \* \*